United States Patent [19]
Torgerson et al.

[11] Patent Number: 5,959,320
[45] Date of Patent: Sep. 28, 1999

[54] SEMICONDUCTOR DIE HAVING ON-DIE DE-COUPLING CAPACITANCE

[75] Inventors: Paul Torgerson, Inver Grove Heights; Scott King, Prior Lake, both of Minn.

[73] Assignee: LSI Logic Corporation, Milpitas, Calif.

[21] Appl. No.: 08/819,299

[22] Filed: Mar. 18, 1997

[51] Int. Cl.$^6$ .................................................. H01L 27/108
[52] U.S. Cl. .................... 257/296; 257/300; 257/306; 257/307
[58] Field of Search ...................... 257/296, 532, 257/306, 307, 300, 534, 916, 924, 754

[56] References Cited

U.S. PATENT DOCUMENTS

| | | |
|---|---|---|
| 5,668,399 | 9/1997 | Cronin et al. ............................ 257/532 |
| 5,726,485 | 3/1998 | Grass ....................................... 257/532 |
| 5,739,576 | 4/1998 | Shirley et al. ........................... 257/532 |

*Primary Examiner*—Carl Whitehead, Jr.
*Attorney, Agent, or Firm*—Westman, Champlin & Kelly, P.A.

[57] ABSTRACT

An integrated circuit die includes a plurality of semiconductor cells and first and second power supply conductors. The power supply conductors have different relative polarities and are electrically coupled to the plurality of semiconductor cells. A power supply de-coupling capacitor is formed within the die and is electrically coupled between the first and second power supply conductors.

7 Claims, 5 Drawing Sheets

SEMICONDUCTOR DIE HAVING ON-DIE DE-COUPLING CAPACITANCE

BACKGROUND OF THE INVENTION

The present invention relates to integrated semiconductor circuits and, more particularly, to a semiconductor die having a power supply de-coupling capacitor.

A semiconductor die includes a silicon substrate and a pattern of semiconductor devices, such as transistors, resistors and diodes, which are fabricated on the substrate. The devices are electrically interconnected by one or more segments of conductive material which extend along routing layers applied over the top of the semiconductor devices. The conductive segments on one routing layer are electrically coupled to conductive segments on other layers through conductive vias.

Power supply conductors supply power to the individual devices on the die. These power supply conductors are fed by one or more main power supply buses which are typically routed on one of the routing layers along the periphery of the die. An external power supply is then coupled to the power supply buses to provide power to the die.

Each transistor on the die has an interconnect capacitance at its output. When a transistor on the die changes its output state, the transistor either sinks current from the external power supply to charge the interconnect capacitance or sources current to the external power supply to discharge the interconnect capacitance. In essence, the interconnect capacitance at the output of the transistor shares charge with a capacitance in the power supply.

Due to the large distance between the power supply and the transistor, the charge sharing between the power supply and the transistor output is relatively inefficient and generates noise in the rate of change of current at the output with respect to time. This noise has been suppressed to some extent in devices of the prior art by physically coupling an external capacitor across the power supply inputs to the die. However, this method of suppressing noise is also inefficient since the capacitor is still a large distance from the individual transistors in which it shares charge.

SUMMARY OF THE INVENTION

The integrated circuit die of the present invention includes a plurality of semiconductor cells and first and second power supply conductors. The power supply conductors have different relative polarities and are electrically coupled to the plurality of semiconductor cells. A power supply de-coupling capacitor is formed within the die and is electrically coupled between the first and second power supply conductors for holding charge that can be used as needed by local transistors.

In one embodiment of the present invention, the de-coupling capacitor is formed by selectively coupling dummy conductive segments to the power supply conductors. In most fabrication processes, a minimum metal density is required to maintain consistent metal plating. Dummy conductive segments are applied in one or more of the routing layers of the die to provide even metal plating in areas were the metal density is sparse. This increases quality control during die fabrication. When the dummy conductive segments are electrically coupled to one of the power supply conductors, a capacitor is formed between the dummy conductive segments and the other power supply conductor in the areas in which the dummy conductive segments overlap the other power supply conductor. In another embodiment, conductive segments are added during the design process to form such capacitive structure. The power supply de-coupling capacitors can be formed within the I/O region of the die or the core region of the die.

DETAILED DESCRIPTION OF THE PREFERRED EMBODIMENTS

Figure 1:
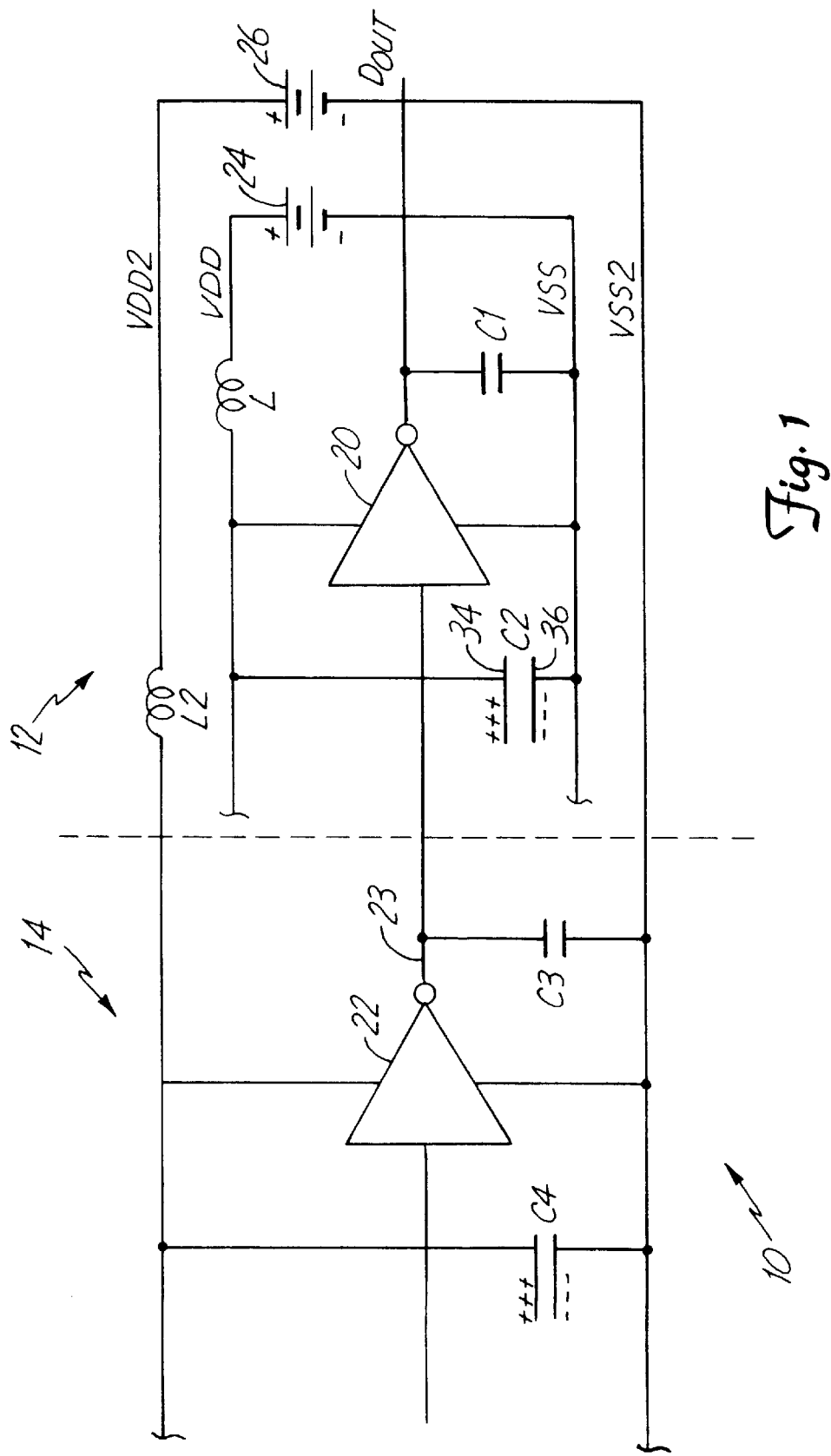
FIG. 1 is a schematic diagram of a semiconductor integrated circuit having power supply de-coupling capacitors according to the present invention.

FIG. 1 is a schematic diagram of a semiconductor integrated circuit 10 having power supply de-coupling capacitors according to the present invention. Semiconductor integrated circuit 10 includes I/O region 12 and core region 14. I/O region 12 and core region 14 each have a plurality of semiconductor devices or cells. For example, I/O region 12 has inverter 20 and core region 14 has inverter 22. Inverter 22 is a predriver which provides a digital signal on output 23 for inverter 20. Inverter 20 receives the digital signal and drives the signal off-chip through output Dout. Inverter 20 forms part of an I/O cell within I/O region 12. Power supply buses VDD and VSS are coupled to external power supply 24 for supplying charge to the semiconductor devices within I/O region 12. Similarly, power supply buses VDD2 and VSS2 are coupled to power supply 26 for supplying charge to the semiconductor devices within core region 14. Inductors L and L2 represent the inductance in supply busses VDD and VDD2, respectively.

Capacitor C1 represents the interconnect capacitance on the output of invertor 20. When the output of invertor 20 changes state, invertor 20 either sources current into capacitor C1 or sinks current from capacitor C1. The charge needed during switching is provided by power supply 24 over supply buses VDD and VSS. Thus, power supply 24 shares charge with capacitor C1. The capacitance provided by power supply 24 is relatively inefficient since power supply 24 is external to semiconductor integrated circuit 10 and is thus a great distance from inverter 20. This has a tendency to create noise in the rate of change of current with respect to time at the output of invertor 20.

In accordance with the present invention, a power supply de-coupling capacitor C2 is formed in the die structure between supply buses VDD and VSS in the vicinity of inverter 20. Capacitor C2 is formed by expanding unused metal structures ("dummy metal") in I/O region 12 to physically overlap power supply bus VDD or power supply bus VSS and then electrically coupling the dummy metal to the other power supply bus. Capacitor C2 includes plates 34 and 36. In one embodiment, plate 34 is formed by supply bus VDD, and plate 36 is formed by dummy metal that overlaps supply bus VDD. One end of the dummy metal that forms plate 36 is coupled to supply bus VSS such that plates 34 and 36 have opposite polarity.

In another embodiment, plate 36 is formed by supply bus VSS, and plate 34 is formed by dummy metal that overlaps supply bus VSS. One end of the dummy metal that forms plate 34 is coupled to supply bus VDD such that plates 34 and 36 have opposite polarity. In either embodiment, capacitor C2 holds charge that can be used as needed by local transistors during switching. Capacitor C2 has a physical location that is very close to the semiconductor devices that require charge during switching and thus decreases the noise in the rate of change of current with respect to time that is associated with device switching.

Similarly, capacitor C3 represents the interconnect capacitance between output 23 of inverter 22 and the input of inverter 20. A power supply de-coupling capacitor C4 is formed between supply buses VDD2 and VSS2 by expanding dummy metal in core region 14 to physically overlap power supply straps that are coupled to power supply bus VDD2 or power supply bus VSS2. The dummy metal is then electrically coupled to the other power supply bus having opposite polarity.

Figure 2:
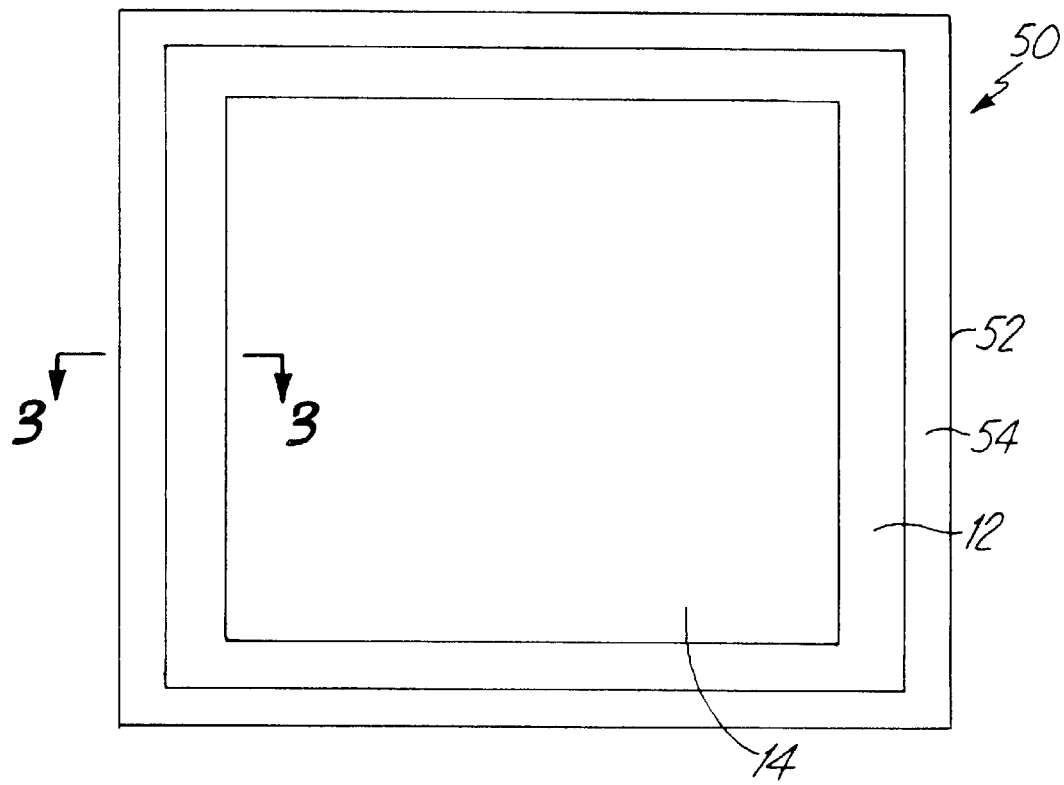
FIG. 2 is a plan view of a semiconductor die in which the circuit shown in FIG. 1 can be fabricated.

FIG. 2 is a plan view of a semiconductor die 50 in which the circuit shown in FIG. 1 can be fabricated. The same reference numerals are used in the various figures for the same or similar elements. Die 50 includes I/O region 12, core region 14, perimeter 52 and scribe region 54. I/O region 12 extends along scribe region 54 and surrounds core region 14. Die 50 has a plurality of routing layers for routing interconnections between the devices within I/O region 12 and core region 14. Each interconnection or "wire" includes one or more segments of conductive material which are routed in a specified pattern within the various routing layers on-die 50.

Figure 3:
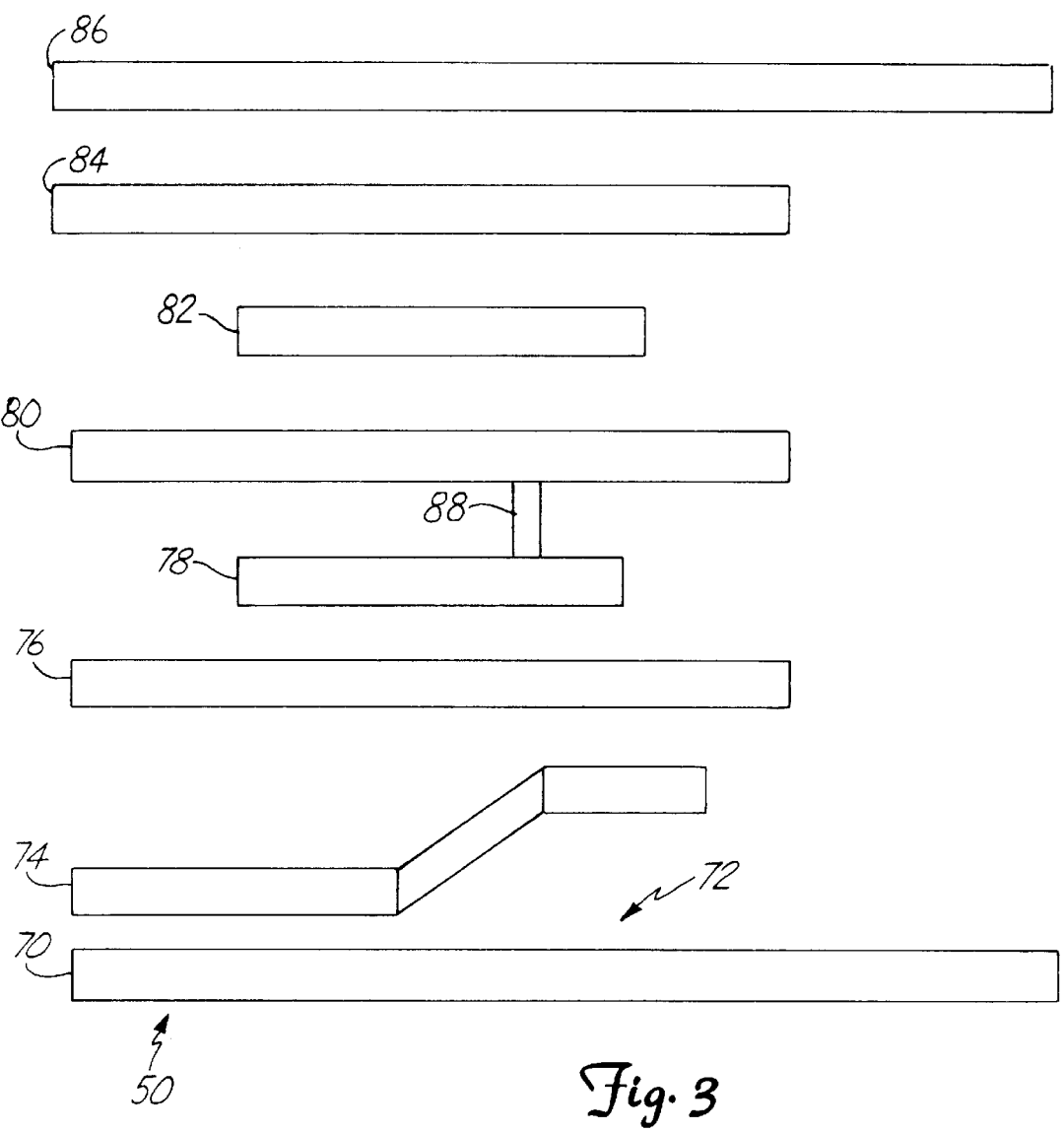
FIG. 3 is a schematic representation of a cross section of the die taken along lines 3—3 of FIG. 2.

FIG. 3 is a schematic representation of a cross section of die 50 taken along lines 3—3 of FIG. 2. Die 50 includes silicon substrate surface 70, polysilicon layer 74, routing layers 76, 78, 80, 82 and 84 and silicon dioxide layer 86. The semiconductor devices are fabricated between silicon substrate surface 70 and polysilicon layer 74 in the area shown generally at 72. Routing layers 76, 78, 80, 82 and 84 are applied over polysilicon layer 74 and are separated by dielectric layers (not shown). These routing layers are referred to as "metal 1", "metal 2", "metal 3", "metal 4", and "metal 5" routing layers. The horizontal dimension of each layer shown in FIG. 3 schematically indicates a preferred routing direction within that layer. For example, metal layers 1, 3 and 5 have a preferred routing direction along width of the page, while metal layers 2 and 4 have a preferred routing direction into the page. Other routing orientations can also be used. The conductive segments on one routing layer are interconnected with the conductive segments on other routing layers or with the semiconductor devices in area 72 through conductive vias which extend vertically between the routing layers. For example, via 88 interconnects a conductive segment on the metal 3 routing layer with a conductive segment on the metal 2 routing layer.

In one embodiment, power supply buses VDD, VSS, VDD2 and VSS2 are routed within the metal 3 routing layer and extend along the perimeter of die 50 within I/O region 12 (shown in FIG. 2) The signal wires which functionally interconnect the devices within I/O region 12 and core region 14 are typically routed within the metal 1 and metal 2 routing layers. However, in alternative embodiments, these signal wires can be routed within any of the metal routing layers. Power and ground straps which provide power to the various devices with I/O region 12 and core region 14 are routed within the metal 1 and metal 2 routing layers and are coupled to the power supply buses in the metal 3 routing layer through conductive vias. Additional power and ground straps can be routed within the metal 4 and 5 routing layers or other, higher routing layers.

Figure 4:
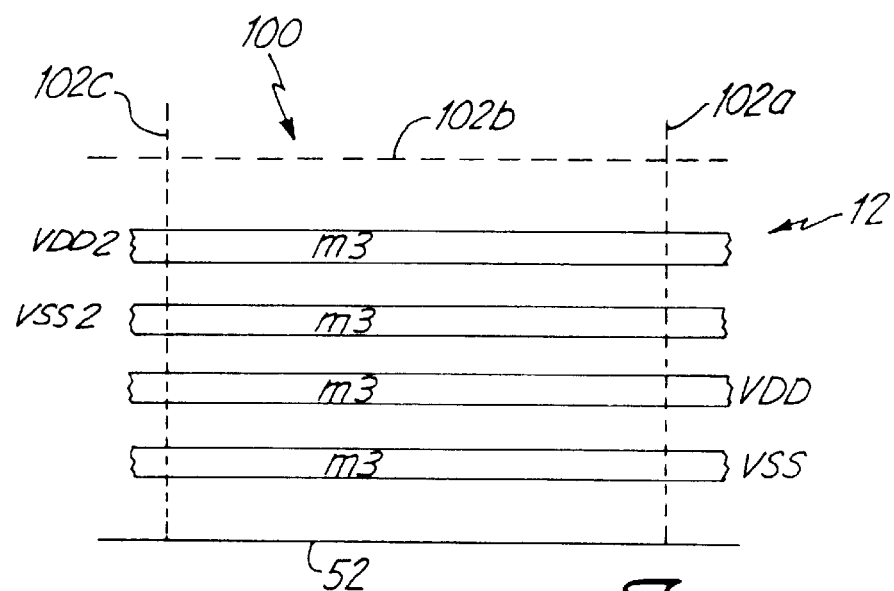
FIG. 4 is a plan view of an I/O cell within an I/O region of the die.

FIG. 4 is a plan view of an I/O cell 100 within I/O region 12, which illustrates the routing of power supply buses VDD, VSS, VDD2 and VSS2. I/O cell 100 is positioned adjacent perimeter 52 and has a cell boundary defined by dashed lines 102a, 102b and 102c. Power supply buses VDD, VSS, VDD2 and VSS2 extend through I/O cell 100 generally parallel to perimeter 52. The label "M3" indicates that these buses are routed along the metal 3 routing layer. In alternative embodiments, the power supply buses are routed in any of the metal routing layers. Buses VDD and VSS supply power to the semiconductor devices within I/O region 12 and buses VDD2 and VSS2 supply power to the semiconductor devices within core region 58.

Figure 5:
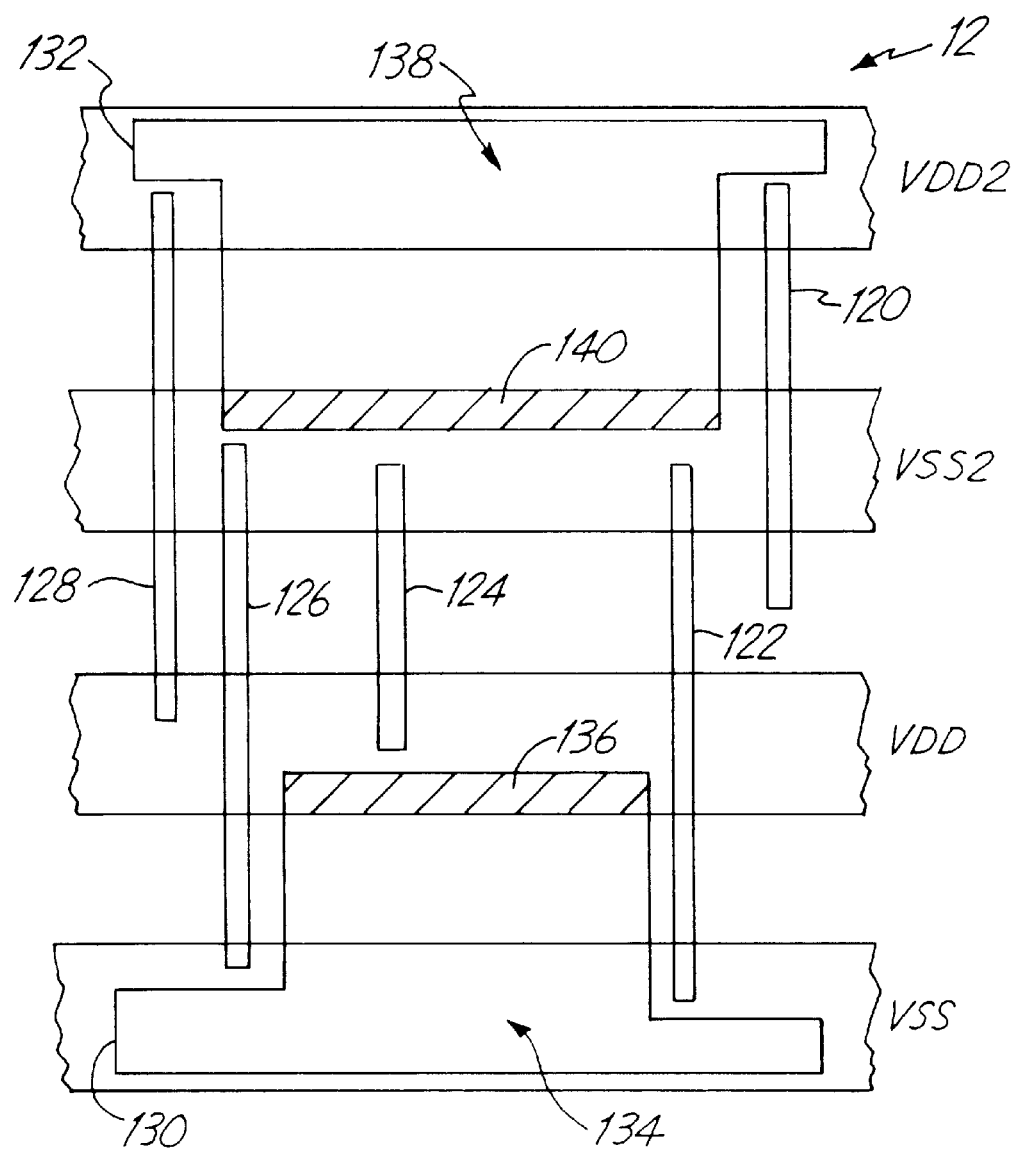
FIG. 5 is a fragmentary plan view of the I/O region, which has on-die power supply de-coupling capacitors according to the present invention.

FIG. 5 is a plan view of a portion of I/O region 12 illustrating the metal routing patterns of the metal 2 routing layer and the metal 3 routing layer superimposed on one another. Power supply buses VDD, VSS, VDD2 and VSS2 extend horizontally along the figure within the metal 3 routing layer. Conductive segments 120, 122, 124, 126 and 128 are signal wires which extend vertically along the figure within the metal 2 routing layer. Conductive segments 130 and 132 are formed of otherwise unused metal, such as dummy metal, which is applied in the metal 2 routing layer between signal wire segments 120, 122, 124, 126 and 128. Dummy metal is often applied in unused areas to maintain an even metal plating process, particularly in areas where metal plating is sparse. The metal for conductive segments 130 and 132 can also be applied during the semiconductor design process in areas of light signal routes to mimic the dummy metal and form desired capacitive structures, as discussed below.

A portion of conductive segment 130 overlaps supply bus VSS in area 134. Conductive segment 130 is electrically coupled to supply bus VDD through via 136. Since supply bus VDD has an opposite polarity than supply bus VSS, and since conductive segment 130 is separated from supply bus VSS by a dielectric layer, the portion of conductive segment 130 that overlaps supply bus VSS forms a power supply de-coupling capacitor with the overlapped portion of supply bus VSS. This capacitor holds charge that can be used as needed by local transistors within I/O region 12. Although the total capacitance of this capacitor may be low in value, the capacitor is very close to the devices that require charge during switching and is therefore very efficient.

Similarly, conductive segment 132 overlaps supply bus VDD2 in area 138. Conductive segment 132 is electrically coupled to supply bus VSS2 through via 140 such that a power supply de-coupling capacitor is formed in area 138 between conductive segment 132 and supply bus VDD2. This capacitor holds charge that can be used as needed by transistors within core region 14 that are powered from supply buses VDD2 and VSS2. Dummy metal or additional, otherwise unused metal can also be applied in other routing layers to create de-coupling capacitors with the power supply busses. Power supply de-coupling capacitors can also be formed in dummy power and corner cells for even larger power supply de-coupling capacitance.

Additional on-die power supply de-coupling capacitors can be formed within core region 14 of the die by selectively coupling dummy metal to the power and ground straps that are routed within the core region. This is accomplished by adding new metal or expanding unused metal structures to maximize the area in which the unused metal structures overlap the power and ground straps that are connected to VDD2 and VSS2, and then electrically coupling the unused metal structures to the power and ground straps having opposite polarity. The dummy metal used to form the capacitor can be positioned in any of the routing layers that overlap the VDD2 and VSS2 power and ground straps.

Figure 6:
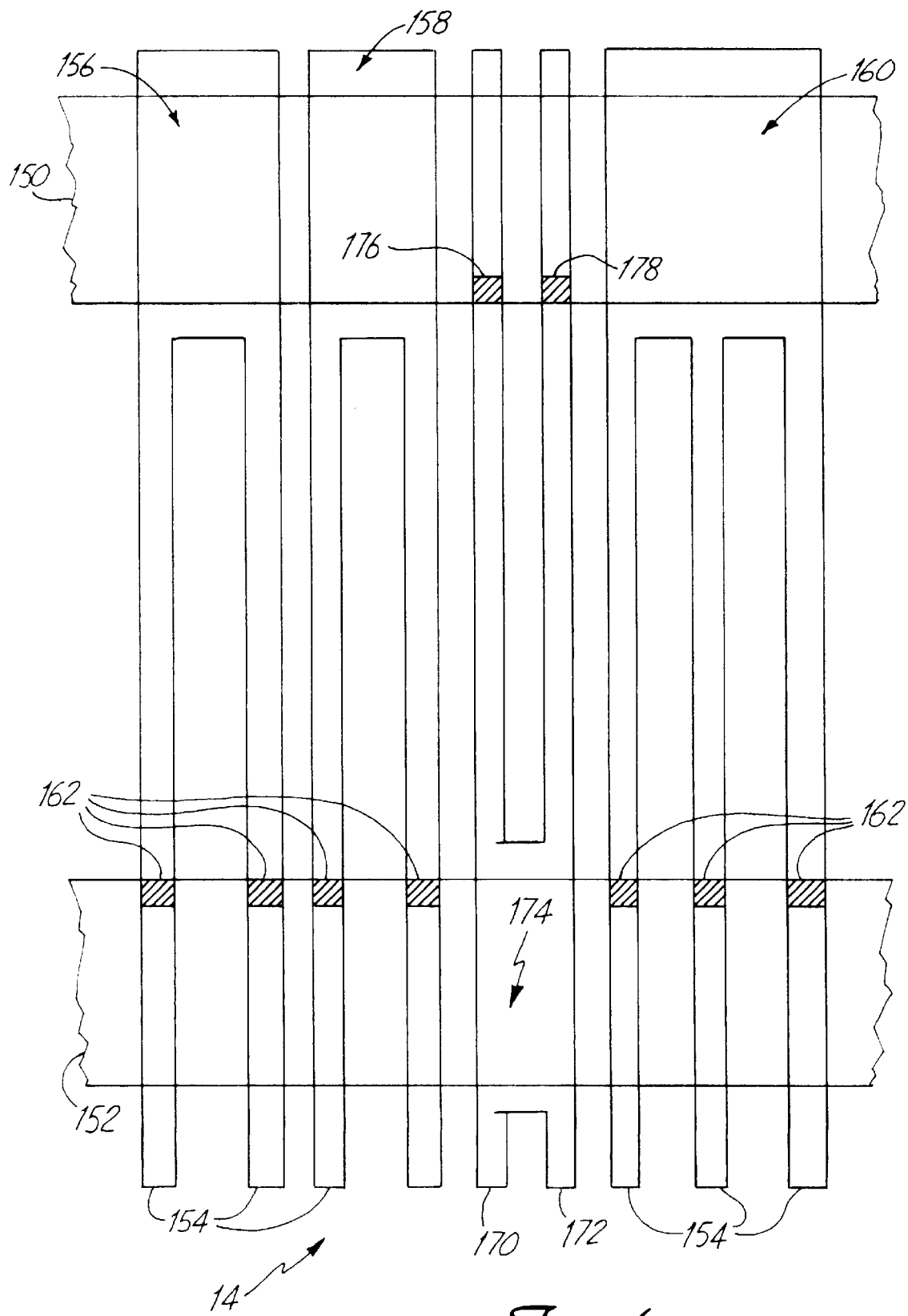
FIG. 6 is a fragmentary plan view of a core region of the die, which has on-die power supply de-coupling capacitors according to the present invention.

FIG. 6 is a plan view of a portion of core region 14 having on-die power supply de-coupling capacitive structures according to the present invention. Core region 14 includes power and ground straps 150 and 152 which extend along the metal 2 routing layer, for example. Dummy metal structures 154 extend along the metal 1 routing layer and have been expanded in areas 156, 158 and 160 to maximize the area in which the dummy metal overlaps power strap 150. Dummy metal structures 154 are electrically coupled to ground strap 152 through vias 162. This forms on-die de-coupling capacitors between the overlapping areas of dummy metal structures 154 and power strap 150.

Similarly, dummy metal structures 170 and 172 extend along the metal 1 routing layer and have been expanded in area 174 to maximize the overlap between dummy metal structures 170 and 172 and ground strap 152. Dummy metal structures 170 and 172 are electrically coupled to power strap 150 through vias 176 and 178 to form an on-die de-coupling capacitor between the overlapping portions of unused dummy metal structures 170 and 172 and ground strap 152.

The on-die power supply de-coupling capacitors of the present invention lowers the noise associated with the simultaneous switching of transistors by providing additional charge in the vicinity of the transistors. A current path is provided so that the additional charge can be used to assist the transistors in switching their outputs. Based on a rough estimate, capacitance of such a structure could be as high as 60 femto Farads (fF) per I/O cell for the VDD and VSS supply buses and 30 fF per I/O cell for the VDD2 and VSS2 supply buses. In the core region, it is estimated that if the additional de-coupling capacitors were applied throughout a 10 mm die, the total capacitance may be on the order of 12 pF. However, these estimates may vary significantly for various applications and depend largely on the total area of the overlap of the dummy metal and the power supply buses.

Although the present invention has been described with reference to preferred embodiments, workers skilled in the art will recognize that changes may be made in form and detail without departing from the spirit and scope of the invention.

What is claimed is:

1. An integrated circuit die comprising:

a perimeter;

a core region within the perimeter;

an input-output (I/O) region which extends along the perimeter and surrounds the core region;

a plurality of semiconductor cells positioned within the I/O region;

first and second routing layers and a dielectric layer positioned between the routing layers;

first and second elongated power supply conductors which have different relative polarities, wherein the first and second power supply conductors are positioned within the I/O region and extend parallel to one another along the perimeter, and wherein the first and second power supply conductors are routed along one of the first and second routing layers; and a plurality of signal conductors routed alone the other of the first and second routing layers within the I/O region and interconnecting the plurality of semiconductor cells;

a conductor segment electrically routed along the other of the first and second routing layers within the I/O region and unused for interconnecting the semiconductor cells, wherein the conductor segment is electrically coupled to the second power supply conductor and has a portion which overlaps a portion of the first power supply conductor within the I/O region to form a capacitor across the dielectric layer.

2. The integrated circuit die of claim 1 and further comprising a third routing layer and wherein:

the first routing layer defines a metal 3 routing layer, the second routing layer defines a metal 2 routing layer and the third routing layer defines a metal 1 routing layer;

the first and second power supply conductors extend along the metal 3 routing layer; and the conductor segment and the plurality of signal conductors extend along one of the metal 1 and the metal 2 routing layers.

3. The integrated circuit die of claim 2 and further comprising:

a conductive via extending from the metal 3 routing layer to the metal 2 routing layer; and wherein the conductor segment extends along the metal 2 routing layer and is electrically coupled to the second power supply conductor through the conductive via.

4. The integrated circuit die of claim 1 and further comprising third, fourth and fifth routing layers and wherein:

the first and second power supply conductors extend along one of the first, second, third and fourth routing layers; and the conductor segment extends along a different one of the first, second, third and fourth routing layers.

5. The integrated circuit die of claim 1 wherein the first power supply conductor comprises a power bus and the second power supply conductor comprises a ground bus.

6. The integrated circuit die of claim 1 wherein the first power supply conductor comprises a ground bus and the second power supply conductor comprises a power bus.

7. An integrated circuit die comprising:

a perimeter;

a core region within the perimeter;

an input-output (I/O) region which extends along the perimeter and surrounds the core region;

a plurality of semiconductor cells positioned within the I/O region;

first and second power supply conductors which have different relative polarities and are electrically coupled to the plurality of semiconductor cells, wherein the first and second power supply conductors are positioned within the I/O region and extend parallel to one another along the perimeter;

a plurality of signal conductors positioned within the I/O region and interconnecting the plurality of semiconductor cells, and defining an unused conductor area between the plurality of signal conductors; and conductor means positioned within the I/O region, in the unused conductor area, wherein the conductor means overlaps the first power supply conductor and is electrically coupled to the second power supply conductor for forming a power supply de-coupling capacitor between the first and second power supply conductors.

* * * * *